United States Patent [19]

Murphy

[11] Patent Number: 4,485,531

[45] Date of Patent: Dec. 4, 1984

[54] STOP PIN

[76] Inventor: Robert Murphy, 1 Timber La., Merrimack, N.H. 03054

[21] Appl. No.: 463,567

[22] Filed: Feb. 8, 1983

[51] Int. Cl.³ ............................................. A47B 21/00
[52] U.S. Cl. ..................................... 24/297; 24/453; 24/584; 361/220; 411/508; 411/509
[58] Field of Search ................. 24/297, 295, 460, 466, 24/584, 453; 206/328, 334; 411/508, 509; 174/52; 361/220; 248/72, 298

[56] References Cited

U.S. PATENT DOCUMENTS

| | | | |
|---|---|---|---|
| 2,909,957 | 10/1959 | Rapata | 411/508 |
| 3,029,486 | 4/1962 | Raymond | 411/509 |
| 3,093,027 | 6/1963 | Rapata | 411/508 |
| 3,093,874 | 6/1963 | Rapata | 411/508 |
| 3,115,225 | 12/1963 | Fraylick et al. | 24/297 |
| 3,153,975 | 10/1964 | Rapata | 24/295 |
| 3,210,820 | 10/1965 | Humiston | 24/584 |
| 3,271,059 | 9/1966 | Pearson | 411/509 |
| 3,309,955 | 3/1967 | Turnbull et al. | 411/509 |
| 3,413,690 | 12/1968 | Pearson et al. | 411/508 |
| 3,485,133 | 12/1969 | Rapata | 411/508 |
| 3,550,217 | 12/1970 | Collyer | 411/509 |
| 3,811,154 | 5/1974 | Lindeman et al. | 24/456 |
| 4,122,583 | 10/1978 | Grittner et al. | 24/297 |
| 4,327,832 | 5/1982 | Dematteo | 361/220 |

FOREIGN PATENT DOCUMENTS

| | | | |
|---|---|---|---|
| 1906133 | 8/1970 | Fed. Rep. of Germany | 248/72 |
| 882898 | 11/1961 | United Kingdom | 24/297 |

Primary Examiner—Victor N. Sakran
Attorney, Agent, or Firm—Pearson & Pearson

[57] ABSTRACT

A pin comprises a head portion, a shank portion, and an end portion flared gradually to a dimension transverse to the pin axis greater than the shank portion. The end portion is slotted to afford resilient resistance to entry and withdrawal into a hole. The pin head portion is disc-like, the shank portion is of uniform circular cross-section about the pin axis, and the shank merges gradually into the slotted end portion to define an hollow oval merging at the tip as a bight, the end portion thus being adapted for snapping into a suitable hole.

The pin is especially adapted to use with a circuit element carrier having an inverted U-channel in which the element is carried. The element may be inserted into a pair of holes in the top and bottom wall of the inverted U-channel, so that the shank of the element serves as a stop to prevent longitudinal escape of an element beyond the pin shank. The pin may be withdrawn after insertion and reused in the same or other holes of the same or other like carriers.

8 Claims, 4 Drawing Figures

STOP PIN

BACKGROUND OF THE INVENTION

Many pins deal with the problem of fastening two parts together, such as a pair of panel members, or a wall member to a wall. U.S. Pat. No. 2,909,957 to Rapata Oct. 27, 1929 for "Resilient Plastic Fastener with Strut Supported Legs" employs a cut shank with shoulders and abruptly extending edges; U.S. Pat. No. 3,029,486 to Raymond Apr. 17, 1962, for Plastic Panel Clip, also describes a panel clip with a pair of shoulders and a shank which is cut or slotted; U.S. Pat. No. 3,093,027 to Rapata June 11, 1963, for Plastic Drive Fastener Having a Radially Collapsible Shoulder describes a pin with a head and a shank flaring directly from the shoulder and having an open partial slot. U.S. Pat. No. 3,093,874 to Rapata June 18, 1963 for Fastener shows a device with a head and a shank with a deformable and returned end to lock in place the pin when inserted. U.S. Pat. No. 3,309,955 to Turnbull et al Mar. 21, 1967, for Fastener With Rotatably Engaged Head has a shank between two shoulders which is formed in a threaded fashion for locking into permanent insertion; U.S. Pat. No. 3,413,690 to Pearson et al Dec. 3, 1968, for Fastener Stud For Assembly in an Apertured Support shows a stud or pin with a head, a shank, a transverse shoulder and flexed arms beyond the shoulder to grasp between the shoulder and and head a trim pad to a vehicle body; and U.S. Pat. No. 3,485,133 to Rapata Dec. 23, 1969 for Drive Fastenener shows a fastener having a head, a shank, and a shoulder beyond which is a collapsible extension to hold the fastener in place.

Also pins are disclosed in Design Pat. No. 240,599 to Solo July 20, 1976 for Molded Wall Fastener, which shows a pin with a pair of shoulders, a shank between the shoulders, and a pointed end portion for insertion into a pin board or the like; Design Pat. No. 256,552 to Rowinski Aug. 26, 1980 for Wall Anchor shows a pin with arms at the head and a shank longitudinally partly slotted; and Design Pat. No. 268,557 to Einhorn, Mar. 30, 1982, for Wall Anchor, shows a wall anchor having a longitudinally apertured shank and a head.

SUMMARY OF THE INVENTION

In accordance with the invention a pin has head portion, a shank portion, and an end portion flared to a dimension transverse to the pin axis greater than the shank portion. The end portion is slotted to afford resilient resistance to entry and withdrawal into a hole. The axial length of the shank portion from head to the greater transverse dimension at the end portion is greater than the outer distance between two holes into which the pin is to be engaged.

Preferably the pin head portion forms a disc-like head about the pin axis, the shank portion is of uniform diameter about the pin axis, and the shank merges gradually into the slotted end portion to define an oval merging at the tip as a bight adapted for snapping into the holes.

The pin is adapted for use with a circuit element carrier having opposed top and bottom longitudinal walls forming a channel in which a circuit element may be held, and having opposite side channels in which the connector side legs of the element may be held. The pin as described may be inserted into a pair of holes in the top and bottom walls of the carier, so that the shank portion then serves as a stop to prevent longitudinal motion in the carrier of the elements beyond the shank portion. The pin may be entered to prevent the motion of the element beyond the shank portion, or withdrawn to permit such motion, and then re-entered, so that the pin is re-usable with the same carrier in the same or other pairs of holes, or with another similar carrier.

DESCRIPTION OF THE DRAWING

The various objects, advantages, and novel features of the invention will be more fully understood from the following detailed description when read in connection with the accompanying drawing, in which like reference numerals refer to like parts and in which.

DESCRIPTION OF A PREFERRED EMBODIMENT

Figure 1:
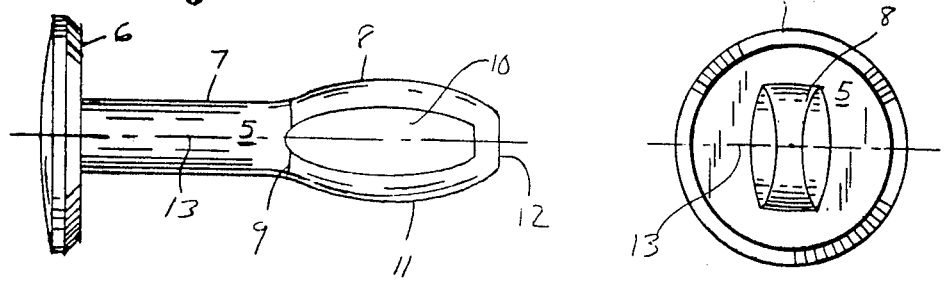
FIG. 1 is a side elevational view of an embodiment of the invention.

Referring to the drawing the pin 5 comprises a head portion 6, a shank portion 7, and an end portion 8. The head portion is disc-like and circularly symmetrical about an axis 13 of the pin. The shank portion 7 is of uniform diameter about the axis 13, extends a substantial distance from the head axially, and then as indicated at 9, merges gradually into the end portion 8. The end portion 8 flares to its largest dimension transverse to the axis 13 at 11, and then diminishes to a blunt point at 12. The end portion may be viewed as slotted with an open portion or slot at 10, and may be described also as forming a loop or bight. As best shown in FIG. 1 end portion 8 defines a hollow oval with gently curved shoulders adjacent shank portion 7, a pair of gently curved, bowed, compressible legs, as at 11, and a closed bight 12 which joins the bowed legs.

Figure 4:
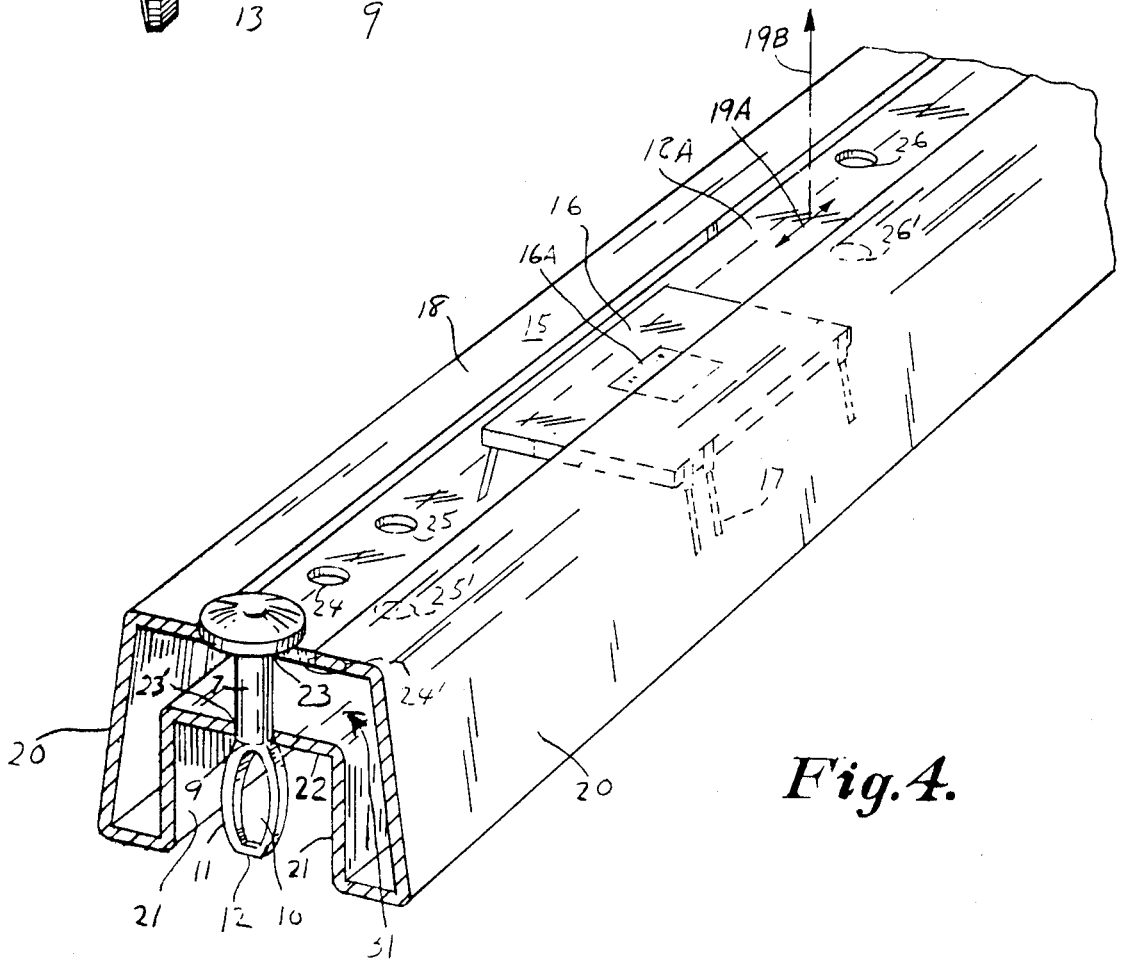
FIG. 4 is a perspective view of a carrier with the pin of FIGS. 1, 2, and 3 inserted in place.

Referring more particularly to FIG. 4, a carrier 15 carries a circuit element 16, which has metallic side legs 17 as terminals or connecting pins or lugs. The element 16 may comprise a chip or integrated circuit element, as known, which is suitably imbedded in a flat rectangular piece of insulating material, the connections to the chip being brought out to the various terminals 17. The element may carry an identifying plate 16A which bears the designation of the chip and the name of the manufacturer.

The carrier has a top longitudinal wall 18, the longitudinal direction being indicated by the double headed arrow 19A. The vertical direction is indicated by line 19B. For purposes of description only, the carrier is shown with its longitudinal axis oriented horizontal. It will be understood that there may be any orientation of the carrier.

The carrier 15 has outer side walls 20 and inner side walls 21. A bottom longitudinal wall 22 joins the inner side walls 21, thus forming a rigid structure. These various walls are integrally formed except that the central longitudinal section 18A of the top wall 18 is transparent, which permits reading of the indentifation label or plate 16A.

Pairs of holes are shown, one of each pair in the top wall 18, as 23, 24, 25, and 26, and the respective other of each pair 23', 24', 25' and 26'. Only the pair 23, 23' is shown with a pin inserted.

The carrier 15 thus provides, by virtue of its walls, an inverted U-channel shaped container, the bottom 31 of the inverted U-shaped channel being formed by the top and bottom walls 18 and 22, and the side channels of the inverted U-shaped channel being formed by the side walls 20, 21. The element 16 may be carried safely within the carrier by inserting the flat portion into the top, inverted U-shaped channel into which it may slide longitudinally, and the legs at the same time entering the side channels wherein they are protected from bending or other injury, the legs being particularly subject to damage. Once the element 16 has been entered into the carrier 15, it should be retained for handling or shipping, and desirably is withdrawn only when ready to be used in a circuit application.

After the element 16 is inserted in the carrier 15, a pin 5 may be inserted, for example through the hole 23 in the transparent wall portion 18A, by forcing the point 12 down and compressing the wide portion 11 inwardly and compressing the sides of the slot 10. As soon as the enlarged end portion 11 clears the hole 23, it is loosely held. Preferably the end portion 8 is made sufficiently long so that it obstructs the bottom channel 31 of the inverted U, and therefore prevents accidental sliding of the element 16 beyond the holes 23, 23A. As shown in the drawing, the end portion 8 is substantially equal in length to the length of shank portion 7 and to the outer distance between the aligned holes 23 and 23' in the parallel walls 18 and 22. Then the end portion of the pin may be inserted into the hole 23A and, in similar manner is forced into the position shown in FIG. 4. The pin shank portion 7 is sufficiently long so that the pin 5 is held in place loosely, and the pin may have some play along the pin axis. The pin shank 7 acts now as the stop, which prevents longitudinal escape of the element 16. The hole pairs may be suitably spaced to receive one or more elements 16, or an integral number, or simply at spaced, convenient intervals, because the elements 16 may be of different kinds and not always uniform in size. There may be as many as twenty pins or more, or there may be only six or eight, which require more or less longitudinal extension of the element, but the widths for several may be standard, so that they may be safely carried in the carrier and secured against loss by the shank 7 at one end and another inserted pin shank at a longitudinally spaced interval.

The pin 5 may be withdrawn to gain access to an element, and returned in place to retain any other element which might otherwise be subject to escape, or an element may be returned to the carrier, and the pin reinserted. Alternatively, the carrier may be emptied by withdrawing a pin, and reused by insertion of other elements, which are retained by reinsertion of the pins. There is practically no wear on the carrier as the pin end portion is compressed as it passes through the holes.

Prior pins generally fail to exhibit a relatively long shank which extends directly from the head, and then expands merging smoothly into a slotted end shank. The pins of the patents noted above are used either to retain in place one wall portion against anther, or to pin in place a thin sheet against a pin board or the like. The pin of the present invention has a different purpose in that the shank is designed to enter a pair of holes, and to act as a retention or stop pin against longitudinal motion transverse to the pin axis of a retained element. The pin itself may be loosely held in place as far as axial motion is concerned and still fulfill it's function of retaining the elements against escape from the carrier in which it is lodged. The prior pins noted above exhibit either a shank with abruptly expanded portion; or a pair of heads, one each extending from a shank; or lack a uniform shank portion; or lack the gradual enlargement from shank to end portion. The reason is that the shank of the present pin of the invention serves a different function in preventing the escape of the elements retained.

Figure 2:
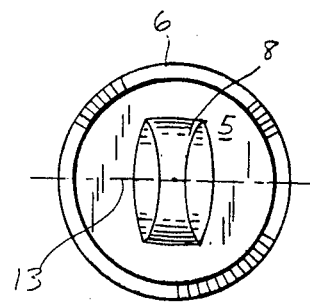
FIG. 2 is an end elevation view as viewed from the right of FIG. 1.
Figure 3:
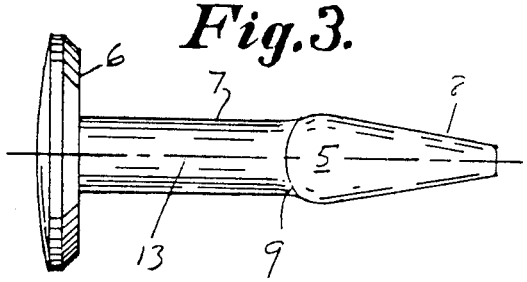
FIG. 3 is an elevational view as viewed from the bottom of FIG. 1.

The pin of the invention is preferably injection molded from a stress resistant plastic material such as nylon or acetate, and nylon has been found preferable. A successful embodiment has an overall length of about 0.630"; a head diameter of about 0.290"; diameter of shank portion 7 is about 0.100"; the largest transverse dimension of the end portion at 11 is about 0.160"; the length of the shank portion 7 is about 0.375" from the head portion 6 to the beginning of the smoothly enlarged end portion at 9; the slot 10 at its widest is about 0.060"; the slot 10 wall is about 0.040" thick, but the slot wall tapers in the direction transverse to the plane of the slot as shown in FIG. 2, from the diameter of the shank portion to about 0.045" at the tip 12 of the end portion, the dimension disignated at FIG. 2 by x". As shown in FIG. 4 the hollow oval elongated end portion 8 is sufficiently long to obstruct the bottom channel 31 and prevent fall-out, even if the pin stop 7 is inadvertently dislodged from hole 23' in transit since the portion 8 would remain in the path of the circuit elements 16. As also shown, the diameter of the cylindrical shank 7 of each pin stop 7 is close to the diameter of the aligned holes such as 23, and 23' for a loose retention therein.

I claim:

1. A stop pin for use with a circuit element carrier having a pair of aligned spaced holes into which the pin is to be inserted, the pin comprising:
   a head portion of greater dimension transverse to the pin axis than the diameter of said pair of holes into which the pin is to be inserted;
   a shank portion of uniform diameter not greater than that of the holes of the pair; and
   an end portion flared to a greater transverse dimension than the uniform diameter of the shank portion, said end portion being of elongated hollow oval configuration to afford resilient resistance to entry and withdrawal, the length of the shank portion from head portion to the greater transverse dimension of the end portion and the length of the elongated hollow oval end portion each being greater than the outer distance between top and bottom walls at the pair of holes;
   whereby the pin is insertable in the pair of holes so that the pin shank portion serves as a stop to longitudinal motion transverse to the pin axis of circuit elements in the carrier, and the pin is then held in place by the resilient oval end portion, and the pin is withdrawable to permit longitudinal motion that was stopped when the pin was inserted.

2. A stop pin as claimed in claim 1:
   said head, shank and end portions of the pin having the axis in common, the head and pin being circular in cross-section transverse to the axis, and the end portion being symmetrical with respect to the axis on opposite sides thereof, and, the shank portion being extended along the longitudinal axis of the pin and the shank portion merging gradually with a smooth enlargement into the hollow oval end portion, to afford easy entry and withdrawal from the holes, subject to the restraint to prevent unintentional removal occasioned by compression of the hollow oval end portion.

3. A stop pin as claimed in claim 2:
the part of the end portion remote from the shank portion being curved gradually from its widest portion to a blunt tip less in cross-sectional dimensions than the diameter of the holes through which the end portion is to pass, for easy entry of the pin into the holes.

4. A stop pin as claimed in claim 2:
said shank portion being of uniform diameter nearly equal to the diameter of said holes the head portion forming a disc like head, and the end portion defining an elongated hollow oval joined at the part near the shank by a smooth enlargement of greater transverse dimension than the diameter of the shank portion terminating in a blunt tapered tip of less transverse dimension than the diameter of said holes.

5. At least two identical stop pins for use with a circuit element carrier, the carrier having opposed top and bottom longitudinal walls between which a circuit element may be held and having opposite side channels in which connector side legs of the element may be held, said element being thus held in the carrier for slidable longitudinal motion, said carrier top and bottom walls having pairs of vertically aligned central holes, each pair of like diameter and longitudinally spaced, each said pin comprising:
a head portion of greater transverse dimension than the diameter of said holes;
a shank portion of uniform diameter not greater than that of the holes of a pair: and
an end portion of greater transverse dimension than the shank portion, said end portion being shaped as an elongated hollow oval to afford resilient resistance to entry and withdrawal, the length of the shank portion from said head portion to the greater transverse dimension of said end portion and the length of said end portion being substantially equal to the outer distance between top and bottom walls at the pair of holes to ben engaged;
whereby when two stop pins are entered respectively into two pairs of the holes, the shank portions of each pin prevent slidable movement of any one or more circuit elements held in the carrier between these two stop pins beyond the longitudinal space between the shank of these two stop pins.

6. At least two stop pins as claimed in claim 5, said head, shank, and end portion of each pin having a common axis which is substantially vertical and at right angles to the carrier axis when the pin is engaged in a pair of the holes, the head and shank portions having circular cross-sections about the pin axis in a sectional view normal to the pin axis, the elongated, hollow oval end portions having a pair of smoothly enlarged, spaced, gently curved bowed legs terminating in a tapered blunt tip of less transverse dimensions than the diameter of said holes.

7. A pin stop for use in the aligned holes in the parallel upper and lower walls of protective tubing, in which integrated circuits are slidably carried for shipment, said holes having a predetermined outer distance therebetween, said pin stop comprising:
a generally rivet shaped elongated, one piece body having;
a disc like head portion of predetermined diameter greater than the diameter of said holes;
an elongated, cylindrical shank portion of uniform diameter, integral with said head portion and having one end joined thereto and having the other end extending from said head portion a predetermined distance slightly greater than the space between said walls; and
a hollow, generally oval shaped, elongated tip portion integral with the said other end of said shank portion, said hollow oval tip portion being formed by a pair of gently bowed, radially outwardly projecting legs defining smoothly enlarged shoulders adjacent said shank portion and terminating in a closed blunt bight joining said legs;
said hollow oval shaped, elongated tip portion being substantially equal in length to the length of said shank portion and to the outer distance between said aligned holes and being of greater transverse dimension than the diameter of said holes but being radially inwardly compressible to pass through said holes under axially exerted pressure.

8. A retaining device for insertion in the aligned holes of the parallel, spaced apart, walls of inverted, U-shaped, extruded tubing protectively packaging integrated circuits to prevent slidable fall-out thereof from the ends of said tubing said retaining device comprising:
an elongated pin stop, of rivet-like configuration, having an elongated shank portion of uniform circular cross-section slightly less than the diameter of said holes and slightly greater in length than the space between said parallel walls;
an integral disc-like head portion of enlarged diameter at one end of said shank portion; and
an integral, elongated, hollow oval end portion at the other end of said shank, said end portion being of greater transverse dimension than the diameter of said shank portion to form a pair of smoothly enlarged integral, bowed legs terminating in a loop, or bight, forming a blunt point and joining said legs, said legs and loop being resiliently flexible, and compressible to pass through said holes with a snap fastener fit;
said oval end portion being of a length substantially equal to the outer distance between said holes so that if said pin stop is disloged to move said shank portion out of said holes, said end portion still retains said circuits from falling out.

* * * * *